(12) United States Patent
Calvignac et al.

(10) Patent No.: US 8,447,441 B2
(45) Date of Patent: May 21, 2013

(54) AIRCRAFT POWER MANAGEMENT SYSTEM

(75) Inventors: Julien N E Calvignac, Grenoble (FR); Marc Pons Perez, Barcelona (ES)

(73) Assignee: Rolls-Royce PLC, London (GB)

( * ) Notice: Subject to any disclaimer, the term of this patent is extended or adjusted under 35 U.S.C. 154(b) by 237 days.

(21) Appl. No.: 12/829,692

(22) Filed: Jul. 2, 2010

(65) Prior Publication Data

US 2011/0178648 A1    Jul. 21, 2011

(30) Foreign Application Priority Data

Jul. 16, 2009   (GB) .................................. 0912340.7

(51) Int. Cl.
    *G06F 7/00*      (2006.01)
    *G06F 19/00*    (2006.01)
    *G05D 17/00*    (2006.01)

(52) U.S. Cl.
    CPC . *G06F 7/00* (2013.01); *G06F 19/00* (2013.01); *G05D 17/00* (2013.01)
    USPC .................. 701/3; 701/14; 700/286; 700/291

(58) Field of Classification Search
    USPC .. 701/1, 3, 7, 8, 10, 14, 36, 15, 100; 700/295, 700/286, 291; 290/40 B, 52, 4 R; 322/44, 322/28; 60/773, 238, 239; 416/27, 28; 244/53 R, 58, 202, 135 R, 175
    See application file for complete search history.

(56) References Cited

U.S. PATENT DOCUMENTS

| | | | | |
|---|---|---|---|---|
| 5,623,197 A | * | 4/1997 | Roseman et al. | 320/134 |
| 5,893,040 A | * | 4/1999 | Gunn et al. | 701/15 |
| 6,062,513 A | * | 5/2000 | Lambregts | 244/175 |
| 6,459,963 B1 | * | 10/2002 | Bennett et al. | 701/3 |
| 6,823,253 B2 | * | 11/2004 | Brunell | 701/100 |
| 7,011,498 B2 | * | 3/2006 | Vos et al. | 416/28 |
| 7,285,871 B2 | * | 10/2007 | Derouineau | 290/52 |
| 7,561,946 B1 | * | 7/2009 | Schipper | 701/8 |
| 7,615,881 B2 | * | 11/2009 | Halsey et al. | 290/52 |
| 2005/0103931 A1 | | 5/2005 | Morris et al. | |
| 2008/0058998 A1 | * | 3/2008 | Breit | 700/295 |
| 2009/0118874 A1 | * | 5/2009 | White et al. | 701/3 |

FOREIGN PATENT DOCUMENTS

| | | | |
|---|---|---|---|
| EP | 1 698 774 A2 | | 9/2006 |
| GB | 2 437 163 A | | 10/2007 |
| KR | 2002-050002 | * | 8/2002 |
| WO | WO 2006/023981 A1 | | 3/2006 |

OTHER PUBLICATIONS

British Search Report for GB 0912340.7 dated Nov. 13, 2009.

* cited by examiner

*Primary Examiner* — Thomas Black
*Assistant Examiner* — Dale W Hilgendorf
(74) *Attorney, Agent, or Firm* — Oliff & Berridge, PLC (57) ABSTRACT

A method and associated system for managing power within an aircraft electrical system, the aircraft having a generator driven by a gas turbine engine for the supply of electrical power to the system, wherein the generator and electrical system are connected to a common energy store. The method includes determining predicted electrical energy demands of the system and predicted thrust demands for the gas turbine engine over at least a portion of a flight. A plurality of time periods within at least a portion of the flight are defined and a desired rate of charge of the energy store for each time period is determined based upon the predicted thrust and electrical energy demands over the time period. The rate of charge of the energy store is controlled during the flight in accordance with the determined desired rate of charge for each time period.

17 Claims, 5 Drawing Sheets

AIRCRAFT POWER MANAGEMENT SYSTEM

BACKGROUND

The present invention relates to power management systems for aircraft and more particularly, although not exclusively, to a system for managing electrical power derived from a gas turbine engine.

The intended flight path of an aircraft is often known prior to flight, for example, by an airline. In the search for greater operational efficiency of aircraft, it has been proposed that an optimal flight path can be determined in advance of a flight based upon navigational considerations, atmospheric conditions, air traffic management factors and/or other external factors which may have an impact on the aircraft.

Furthermore it is known to monitor gas turbine engine performance and health in service with the aim of identifying potential problems and improving engine efficiency. Conventional studies of engine performance have generally concentrated on providing the required thrust for the aircraft at optimum fuel efficiency. That is to say, the operational performance of the engine is refined to reduce fuel burn.

However trends in civil and defence aerospace are towards increasing onboard energy demands during flight for powering onboard electrical equipment. It has been proposed that such increased demands for electrical energy in flight may be met by one or more electrical generators driven by gas turbine engines. Furthermore, the potential efficiency improvements offered by hybrid engine arrangements place further emphasis on the need for electrical power generation in flight.

SUMMARY

A problem exists in that electrical power may be required by onboard electrical systems at various times and so it is required to provide energy storage means such that electrical energy is readily available when required. The capacitance-to-weight ratio of conventional energy storage devices (ESDs) makes it impractical to provide a large energy storage means with sufficient redundancy to cater for a broad range of potential operational scenarios.

It is an aim of the present invention to provide for an aircraft power management system which draws energy from a gas turbine engine in an efficient manner.

According to one aspect of the present invention there is provided an aircraft power management system comprising a gas turbine engine, a generator connected thereto and arranged to supply electrical power to the airframe in use, an energy storage device electrically connected to the generator and airframe, and a controller arranged to control the rate of charge of the energy store by the generator in use, wherein the rate of charge of the energy store is controlled base upon the predicted airframe electrical energy demands and the predicted engine thrust demands during the entire flight.

The present invention provides particular advantages in that the rate of charge of the energy store can be controlled in such a manner as to improve the efficiency of the aircraft power system. By determining the predicted airframe energy loads for the entire flight in advance, the thrust demands of the engine and the electrical power provided to the airframe by the ESD can be balanced over time to achieve efficient use of the available power source and induce low consumption.

The use of the rate of charge as the control measure allows the present invention to be capable of implementation for a very broad range of engines, aircraft and flight requirements and may also avoid the need to modify the gas turbine control scheme.

According to a second aspect of the present invention there is provided a method of controlling the supply of electrical energy between a generator driven by a gas turbine engine and an airframe, wherein the generator and airframe are connected to a common energy store, the method comprising: determining or receiving the predicted electrical energy demands over at least a portion of a flight, determining or receiving the predicted thrust demands on the gas turbine engine over at least said portion of the flight; defining a plurality of time periods within at least said portion of the flight; determining a desirous rate of charge of the energy store for each time period based upon the predicted thrust and electrical energy demands over said time period; and controlling the rate of charge of the energy store over at least said portion of the flight in accordance with the determined desirous rate of charge for each time period.

Either aspect may implement a recursive processing technique which iterates towards a desired state of charge for a plurality of time instants spaced over said at least portion of the flight. Time periods may be defined as the duration between time each instant in time. The determined desirous change in state of charge between each instant in time may be used to define a corresponding desirous rate of charge for each time period. Time periods or segments are preferably of magnitude of minutes or hours. However the precise length of the time periods will typically be determined by the length of operation of the gas turbine engine for a flight. The duration of operation of the gas turbine engine may be divided into a plurality of macro-scale time periods such that each flight may contain anywhere between three and, for example, thirty time periods.

One or more recursive algorithms may predict an optimal incremental change to the state of charge of the energy store for each time increment over the at least portion of the flight. In one embodiment, the time periods are consecutive or successive and may collectively comprise a total flight of an aircraft from take-off to landing.

The time periods may be referred to herein as flight phases or segments.

A plurality of possible states of charge may be determined for each time interval. One of said plurality of states of charge may be selected to suit the global optimisation for the flight period.

According to one embodiment, the predicted electrical energy demands and the predicted thrust demands may be considered fixed. The present invention may control only the rate of charge of the energy store and the associated power drawn from the engine via the generator for charging the energy store. As a secondary effect the thrust produced by the engine may vary based upon the power drawn from the engine. In such a scenario, the system would typically favour optimisation of fuel efficiency.

Boundary state-of-charge conditions may be defined for a start and end condition for the at least portion of the flight. A start charge condition may equal the maximum charge capacity of the energy store. An end charge condition may be a minimum charge for the energy store.

The determination of the desirous charge profile may commence with determination of the rate or state of charge over the final time period of the proposed flight and may iterate through each successive time period towards the first time period. The iterative process for calculating charge may advance in a direction backward in time through the duration of the proposed flight.

A plurality of predicted rates of charge for each time period may be determined and a best fit through the plurality of predicted rates of charge for each time period may be determined. The best fit rate of charge may prioritise engine thrust requirements and electrical system loads, followed by fuel efficiency. The controller may control whether available electrical energy is supplied to the aircraft electrical system to satisfy immediate loads or else is supplied to the energy store.

The present invention represents a global approach to energy management. In one embodiment, deviation of the predicted electrical energy demands and/or gas turbine thrust demands during said at least portion of the flight are monitored. Additionally or alternatively, the state of charge of the energy store may be monitored during said at least portion of the flight. Upon deviation of any or any combination of electrical energy demands, gas turbine thrust demands and/or state of charge of the energy store beyond a normal operational threshold of the predicted values, the desirous rate of charge of the energy store may be recalculated for the remainder of said portion of the flight. The rate of charge of the energy store over the remainder of said portion of the flight may be controlled in accordance with the recalculated rate of charge. The desirous rate of charge of the energy store may be recalculated based upon any or any combination of updated electrical energy demands, updated gas turbine thrust demands and/or updated state of charge boundary conditions.

According to a further aspect of the present invention, there is provided a data carrier comprising machine readable instructions for controlling one or more processors to conduct the method of the present invention.

Any of the preferable features described herein may be applied to any aspect of the invention.

It will be appreciated that a discharge from the electrical energy store may be considered to be a negative rate of charge. Accordingly the expression 'rate of charge' as used herein comprises situations in which the rate of charge is positive, negative or else zero.

Working embodiments of the present invention are described in further detail below by way of example with reference to the accompanying drawings, of which:

DETAILED DESCRIPTION

The present invention proposes a novel method of operating an electrical system for which electrical energy is derived from a gas turbine engine via a generator connected thereto. An energy store is provided, for which the desirous state of charge is predetermined based upon predicted desirous operating conditions for the gas turbine engine and electrical system loading throughout the entire flight or at least part thereof. A desirous state of charge profile for the energy store over time is thus determined and implemented by controlling the rate of charge of the energy store to achieve the state-of-charge profile. Using this global approach in which the desired engine and electrical system operating conditions are taken into account over the duration of at least part of the flight, the efficiency of the whole system may be improved. By charging or discharging the ESD, the gas turbine operating point can be moved, which may potentially enhance fuel consumption.

The inventor has focussed on the understanding that the time at which it is most efficient to generate electrical power is unlikely to coincide precisely with the time at which electrical power demands of the airframe are also at their greatest. Accordingly the inventor has determined that the storage of electrical energy can effectively be predicted and planned for the duration of a flight such that instantaneous demands by the airframe do not adversely impact on the system efficiency.

It is important to note that a control system for the supply of power from a gas turbine engine generator to an aircraft's onboard electrical system impacts on both the engine and the aircraft. It will be appreciated that for civil aviation applications in particular the relevant engine, aircraft and flight data may be held by three independent entities, namely a gas turbine engine manufacturer, an aircraft manufacturer and an airline. Furthermore, conventional aircraft electrical systems are very complex and redundant in architecture; comprising AC and DC inter connected networks to ensure reliability and safety. Electrical generator types, location and coupling to the gas turbine spools also differ from one engine to another.

The practical realities of attempting to share the necessary information between such parties and to optimise power management systems to suit the wide variety of available physical and electrical aircraft systems are considered prohibitive to an optimal solution. Conventional understanding is that such levels of coordination between parties would be complicated, time consuming and extremely difficult to achieve. In addition the cost of producing individual solutions which are tailored to suit specific aircraft and flights is a significant deterring factor.

However the present invention proposes a generic strategy which accommodates varying platforms and which allows engine operation and onboard aircraft systems to be optimised independently. The interaction of these entities via a generator and energy store is controlled by an independent variable, namely the rate of charge of the energy store. As will be described by way of example below, this approach may make the implementation of such a control system feasible and realistic by avoiding the need to tightly control the impact of the engine on the airframe electrical system and vice versa for a plethora of operational conditions and flight plans.

The present invention is applied to an aircraft distributed power system.

Figure 1:
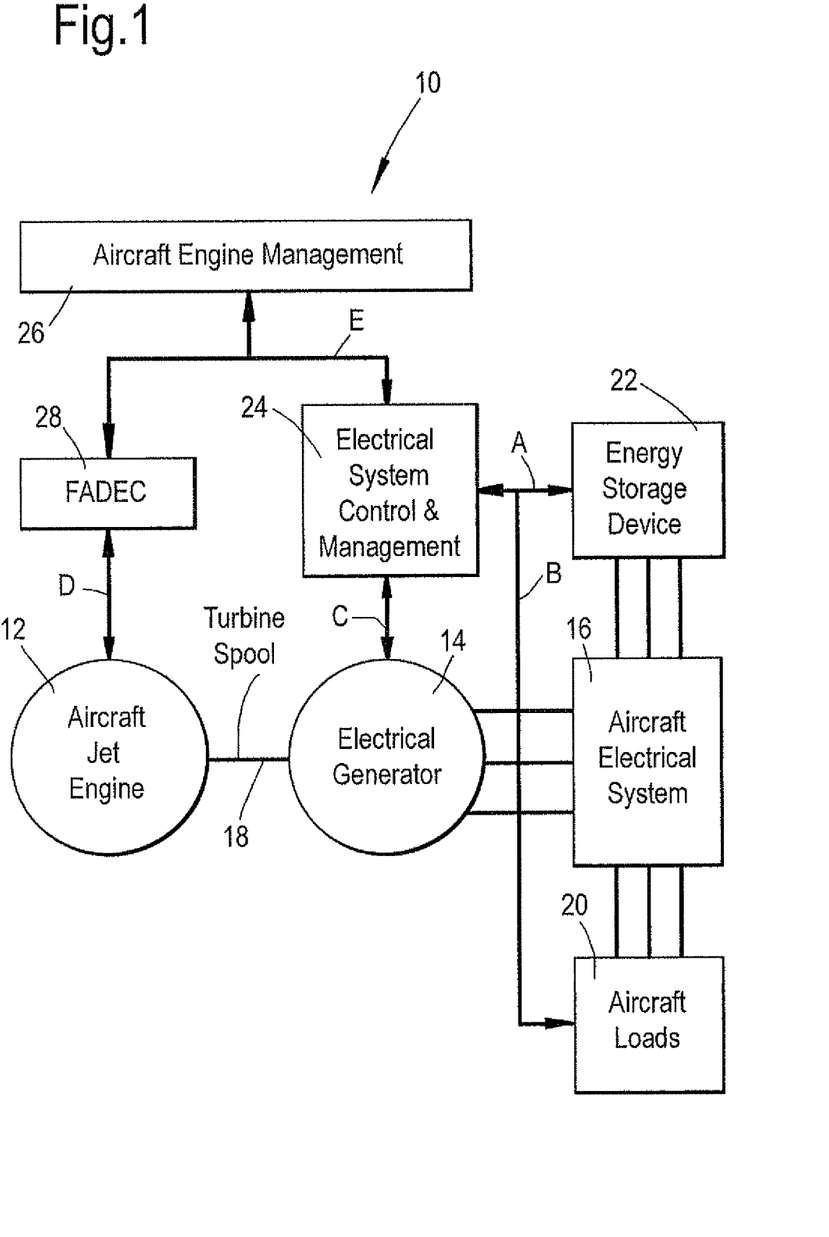
FIG. 1 shows a general schematic layout of a system according to one embodiment of the present invention.

Turning now to FIG. 1, there is shown an exemplary system architecture for implementation of the present invention. The system 10 generally comprises an aircraft gas turbine engine 12 arranged to drive an electrical generator 14 which is electrically connected to an onboard electrical system 16 for an aircraft.

The generator 14 is driven by an engine turbine shaft or spool, represented diagrammatically at 18. It will be appreciated that there exist a number of conventional and proposed methods of driving a generator by a gas turbine engine. In conventional arrangements, for example, a step-aside gearbox arrangement and a suitable drive shaft may be used to transmit torque from a turbine spool to a generator. In proposed alternatives mechanical linkages may be reduced or avoided altogether by providing an internal generator within the engine casing or exhaust nozzle core to take power directly from a turbine spool. The present invention is not limited by the specific details of any particular generator drive arrangement and may be applied to any such arrangement regardless of whether the generator comprises a starter motor setup or an independent generator.

The aircraft electrical system 16 is represented schematically for the purpose of the present invention and in reality comprises a network of electrically connected machines and devices. The demands of such devices are represented collectively at 20 as the aircraft electrical load or loads. The instantaneous loading may be considered to comprise the sum of all electrical devices drawing power from the aircraft electrical system at any one time. Such loads may be attributed to, for example, any or any combination of aircraft navigational equipment, safety equipment, aircraft or engine controls, communication equipment, aircraft cabin heating, ventilation, lighting and/or multimedia equipment.

The aircraft electrical system is provided with a primary energy storage means 22, which comprise batteries, supercapacitors or any other suitable electrical energy storage device (ESD). The energy storage is referred to as the primary energy storage means since it will likely have the largest capacity for electrical energy storage on the aircraft. Thus it can be distinguished from any smaller electrical storage which may be associated for example with individual electrical devices of the airframe electrical system 16. The energy storage 22 is intended to serve the aircraft electrical system 16 as a whole (i.e. the plurality of electrical devices connected thereto), rather than individual electrical components.

Although not shown in FIG. 1, the energy storage means 22 may be connected to the aircraft electrical system via a DC busbar and power converter equipment. The specific type of power converter to be used will be dependent on the specific details of the electrical system and may comprise a DC-DC converter.

The system includes an electrical system controller 24 in communication with at least the energy store 22. The controller 24 comprises one or more processors and associated data transmission and reception circuitry in order to allow wired or wireless data signals to be transmitted and received.

The arrows A-E in FIG. 1 represent communication channels throughout the system 10. The controller 24 is in communication with the generator 14 and energy store 22. The controller also receives data representative of the aircraft electrical loads 20. This may be achieved by communication with an aircraft energy management system 26 or other equipment capable of monitoring the power needs of the aircraft as a whole. Additionally or alternatively, predicted aircraft electrical loads may be determined by the controller or communicated thereto prior to a flight or other sequence of operation. The controller may thus rely on any or any combination of predicted or monitored aircraft electrical loads.

In addition the controller 24 may be in communication with the gas turbine engine control hardware either directly or else via an Electronic Engine Control (EEC) unit of a full authority digital engine control (FADEC) 28.

Whilst the arrows B, C, D and E show two-way communication with the aircraft energy management control 26, generator 14 and FADEC 28, it is to be noted that in the embodiment described below, the controller 24 directly controls the operation of the energy storage device(s) 22 and generator(s) 14 only. Accordingly the communication channels B, D and E from the controller 24 in this embodiment represent the flow of operational data rather than commands or instructions. Such an arrangement allows the performance of those components or systems to be optimized independently, which may benefit the practical implementation of the present invention. Any impact on the operation of those components or systems is thus passive rather than actively controlled by controller 24.

However in further developments of the present invention, it is proposed that two-way communication may allow for operation of any of the engine 12, generator 14 and/or aircraft energy management system 26 to be purposively influenced by the controller 24.

Figure 2:
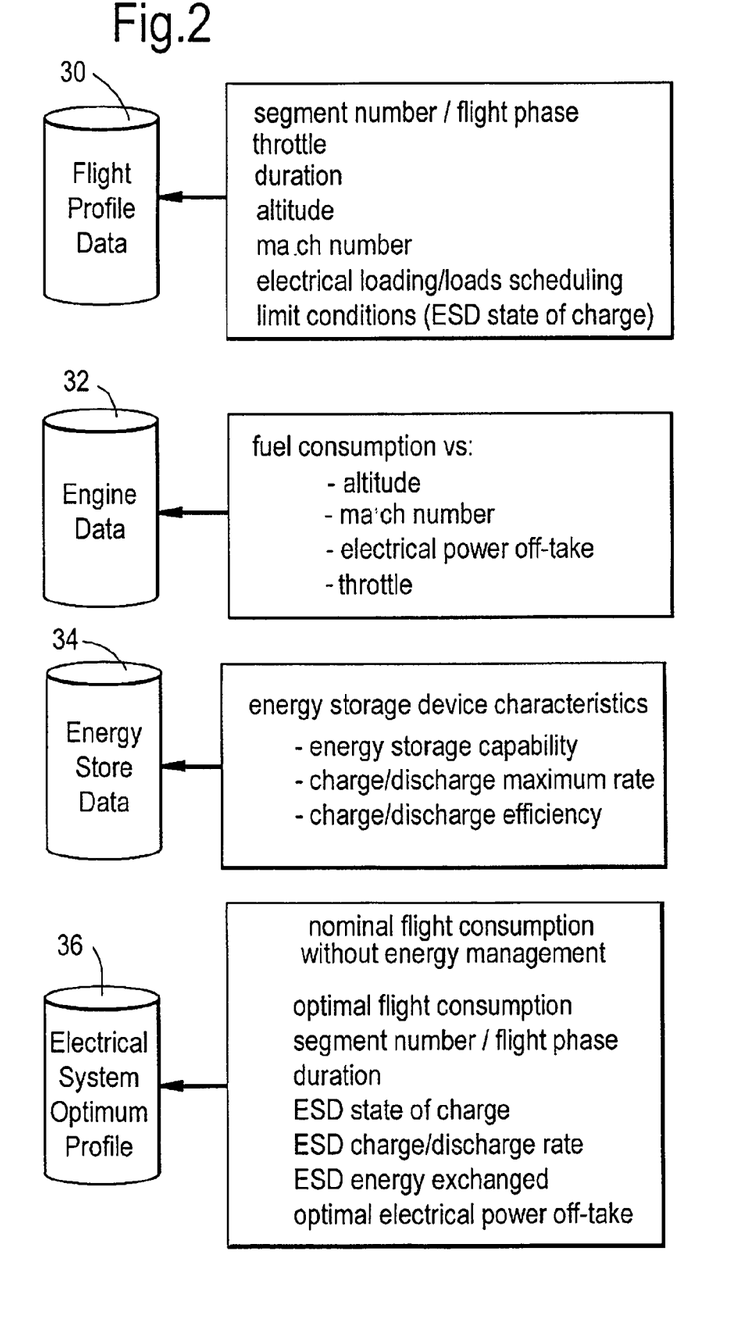
FIG. 2 shows the data which is used by a system according to one embodiment of the present invention.

Turning now to FIG. 2, there is shown details of the data used by one embodiment of the present invention. The data has been collated into a plurality of data groups or sets 30-36 for clarity. Each group may comprise a plurality of data files, each file corresponding to each data type. Alternatively each file may comprise a plurality of different data types, each of which being individually identifiable within the file.

For the purpose of the processing steps to be performed as described below, the proposed aircraft flight is divided into a plurality of phases or segments. The dividing of the flight into segments may be performed by the controller 24 or else by another processing means and communicated to the controller 24

In a simplified embodiment, a flight may for example be divided into three segments, namely ascent, cruise and descent phases. However the flight will typically be divided into a larger number of segments based upon aircraft or engine operating conditions which may comprise any, or any combination, of velocity, altitude, engine throttle and/or aircraft electrical loading. Each segment can be defined in terms of its duration or start and ends times within the total flight. Typically the time segments sum to the total duration of the flight, although the present invention does allow for application to only a portion of the total flight if necessary.

The flight profile data 30 may be received from the airframe systems and comprises indication of the number of flight segments and, for each segment, the associated duration, engine throttle settings, aircraft altitude, velocity (Mach number), the electrical loading on the aircraft electrical system and the timing/scheduling of those electrical loads. The flight profile data 30 may also comprise maximum and/or minimum possible states of charge of the energy storage device 22.

The engine data 32 may be received from an engine controller 28 or the main aircraft monitoring equipment and comprises any or any combination of altitude, velocity, throttle and/or electrical power take-off via the generator 14. Data representative of the above variables may be provided at various time intervals and may be provided along with corresponding values of fuel consumption rates. Such values may be predicted based on previous engine operational data or else may be calculated using predictive algorithms for the engine in question. In the present embodiment, values of fuel consumption are provided against altitude, velocity, throttle and/or electrical power take-off.

Regardless of origin of the predicted flight profile data and engine data, the values contained within those data sets are considered to be fixed within the system according to this embodiment of the invention. This allows the engine operational characteristics to be preset, for example, by the engine manufacturer according to optimal engine performance. Similarly, the electrical loading may be prescribed by an airline in order to meet the electrical device requirements during different stages of the flight.

Energy store data 34 comprises data relating to the functional characteristics of the energy storage means 22, such as the capacity of the energy store; the maximum possible or proposed rates of charge and discharge of the energy store; and, the efficiency of charging and discharging for one or more charge/discharge rates.

Based on the information available from the flight profile data 30, the engine data 32 and energy store data 34, the controller 22 determines a proposed or optimal electrical system profile 36, which comprises proposed state and rate of charge and discharge for the energy store 22 over the plurality of flight segments. The generated electrical system profile data comprises a nominal fuel consumption value for the flight or segment with and without energy management according to the present invention. The generated electrical system profile data also comprises details of the segments numbers and for each segment, its duration; the state of charge of the ESD; the rate of charge or discharge of the ESD; the energy exchanged to/from the ESD; and the optimal power take-off for the generator.

Figure 3:
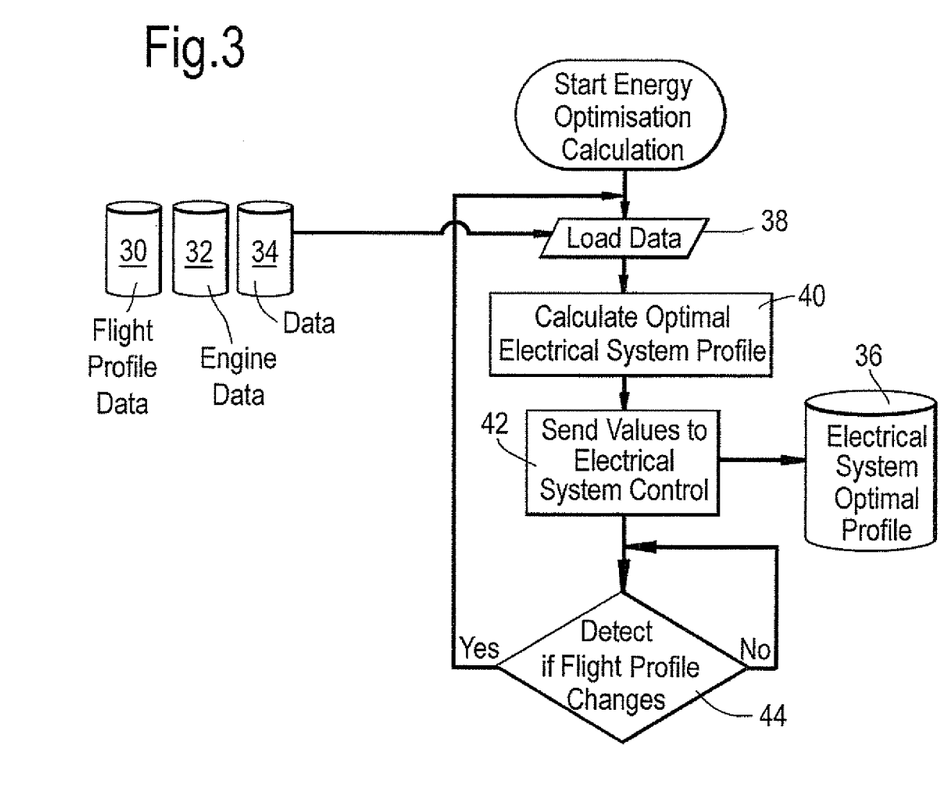
FIG. 3 shows an exemplary flowchart of basic processing and control steps taken in determining a desired operating electrical system profile.

Turning now to FIG. 3, there is shown a flow chart of the steps performed for determining the optimal electrical system profile for the flight, or part thereof. These steps can be carried out by any suitable processing means capable of receiving and transmitting data.

The flight profile data 30, engine data 32 and energy store data 34 is received or loaded by the processor at step 38. The processor comprises machine readable instructions in the form of one or more modules of code for controlling the processor to calculate the optimal electrical system profile at step 40. In this embodiment, the processor is located remotely of the controller 24 and the optimum electrical system profile data is sent to the controller 24 at step 42. In an alternative embodiment, the controller 24 itself may receive the necessary data and generate the optimal electrical system profile.

Once the electrical system profile has been generated, the process enters a monitoring loop at step 44. At this point, the monitors whether there are any changes made to the input data 30, 32 or 34. If no changes are made to the input data, the processor simply maintains the monitoring loop. If any significant changes or updates to the flight profile data 30 or engine data 32 are detected, the process is restarted by reloading, receiving or requesting the relevant updated data 30, 32 and/or 34 and recalculating a revised electrical system profile, which is output at 42.

Figure 4:
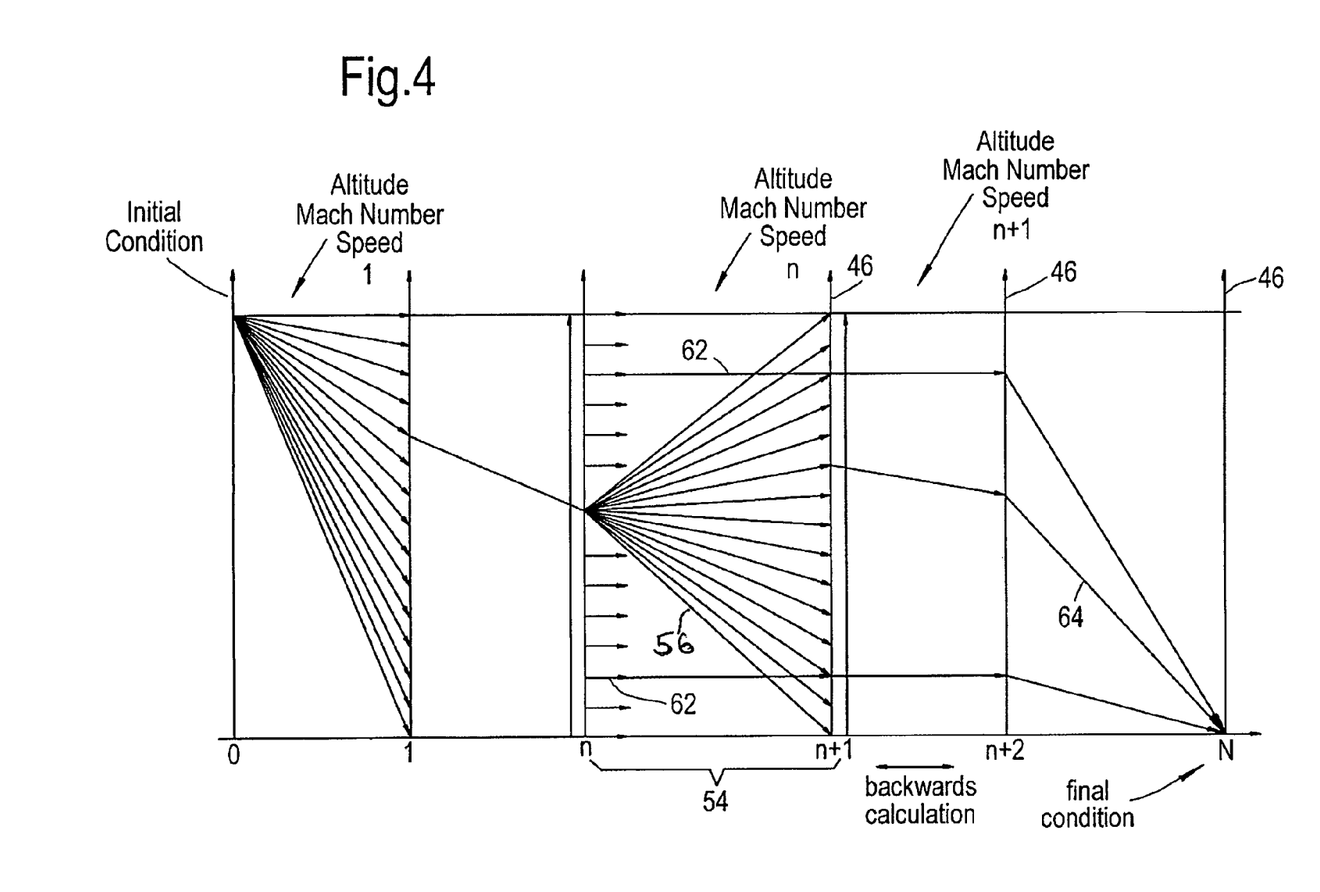
FIG. 4 shows a visual representation of an exemplary method used for determination of the electrical system operating profile of FIG. 3.

Details of the process used for determining the optimum electrical system profile are given in FIG. 4. A recursive process used for determining the desired electrical system profile, in which an algorithm is applied to a first segment and subsequently to an adjacent segment, which steps are repeated for all segments identified. The steps are iterated for each segment such that the process converges to an optimal or desired solution across all segments based on the input data.

In FIG. 4, the X-axis is representative of time and the Y-axis represents the state of charge (SOC) of the energy store 22. A total of N segments are identified by the time periods bounded by adjacent delineations 46. Operational variables defined within the flight profile data 30 and engine data 32 are considered constant across each individual segment. In particular, the altitude, Mach number, engine throttle and electrical loading are considered constant for each segment.

The calculation process initiates with the boundary conditions that the SOC of the energy store 22 is at its minimum value at the end of the final segment, in this case at the end of the flight. In addition the SOC is at its maximum value at the start of the first segment (in this case, at the start of the flight). The minimum and maximum values of the SOC may relate to 0% and 100% respectively when the profile is to be calculated for the entire flight. Accordingly, the most efficient case is that in which the energy is fully charged on the ground prior to take-off and in which the energy store is fully discharged upon landing. However safety thresholds may be factored into the calculation such that the charge never exceeds a maximum safe operating limit and never falls below a minimum safety threshold. In the event that only a portion of the flight is under analysis, the boundary SOC conditions can be set known or predicted values for the stat of the first segment and the end of the final segment for that period.

The calculation commences at the final segment, for which the final SOC boundary condition is known. The algorithm used calculates the desired SOC for the penultimate delineation, that is where the flight segment 'n' is given by n=N−1. This process is repeated for each segment in turn.

An iterative loop is followed during the calculation in which n is reduced by one for each iteration until the condition n=0 is achieved. The following steps are taken by the processor for each iteration (i.e. for each segment in turn):

(a) The available energy from the turbine spool of the gas turbine engine for the segment is calculated using $E_{thrust}$=f (altitude, mach number, temperature, pressure)*duration(n). It will be appreciated that a simplified expression is given above and the actual function may involve a plurality of engine condition values as would be understood by a person skilled in the art.

(b) A variable, namely ΔSOC, is defined, which representative of the change in SOC for the segment, with reference to the value of SOC known for the previous segment, SOC(n+1,j). Accordingly, ΔSOC(n)=SOC(n+1,j)−SOC(n,i)

Figure 5:
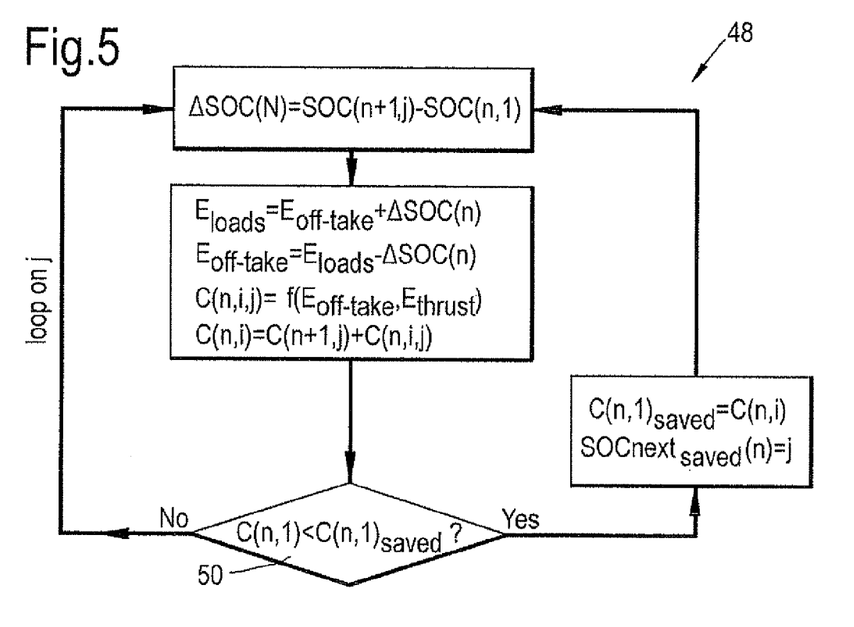
FIG. 5 shows further detail of the algorithms used to determine a desired operating electrical system profile; and, FIG. 6 shows basic control steps taken to implement a desired electrical system operating profile.

(c) A series of calculations are performed in order to determine the energy to be produced by the generator during a flight segment as shown at 48 in FIG. 5. Once the energy to be generated is known, there is a check mechanism to evaluate if this value is not null (that would mean the ESD only provides power to the loads) or if the power to be generated by the generator is not above its nominal value. If it is not the case, such possible states are disregarded and a suitable rate of charge can be determined.

Then, the rate of charge is determined by dividing the energy stored or released by the ESD over the duration of the segment. The following definitions of terms are given to aid in understanding of the terms used at 48:

$E_{loads}$—Predicted electrical energy consumed by the loads in this segment.

$n_{store\_in}$—Efficiency of the ESD when charging $n_{store\_out}$—Efficiency of the ESD when discharging $E_{offtake}$—Electrical energy produced $E_{thrust}$—Energy necessary to maintain thrust $C(n, i)$—The criteria for the segment n and a given state 'i'. The criteria values are taken from flight profile and engine data 30, 32 described above and are considered constant for the duration of each individual segment.

$C(n, i)_{saved}$—The minimum value of the criteria for the segment n and state i.

$C(n, i, j)$—Cost value or criteria to reach state j of segment n+1 from state T of segment n.

$C(n+1,j)$—The criteria or the segment n+1 and the state j, saved by the algorithm at the previous calculation step. This corresponds to the best value of the criteria from that point to the end of the flight.

(d) Once the calculation for the desired state and rate of charge has been performed, the resulting criteria is compared to a saved value of the criteria for the segment at step 50 to determine whether if the cost associated to this criteria is less than any of the previously saved value.

Following the above steps, a check may be made to determine whether a boundary condition has been reached such that desired operating conditions have been determined for all segments.

Returning now to FIG. 4, it is shown by way of example for a nominal segment, 54, having a segment number 'n', a plurality of potentially attainable states of charge, SOC(n+1, j), at the end of the segment can be achieved over the segment for a given starting state of charge, SOC(n, i). The various possible rates of charge or discharge over the segment 54 are represented by lines 56. For the segment number n, the potential state of charge are SOC(n,i).

By way of illustration, numeral 62 denotes the saved path and criteria from state SOC(n,i+5) or SOC(n,i−5) to the next segment and to the end of the flight.

This algorithm is repeated for each segment the global view of the charging and discharging schedule for the energy store 22 can be assessed and an optimal profile 64 for the flight is automatically selected. This iterative process converges towards an ideal charge/discharge profile based on the available inputs with the target of overall flight fuel consumption reduction.

It is proposed that the system calculates the optimum energy storage device profile prior to flight, whilst allowing for corrective action to be taken if the aircraft deviates from the predicted operating conditions. In the event that recalculation is required due to deviation from the predicted profile, such recalculation is carried out in respect of the remainder of the flight without taking into account past data and events. This may be achieved by alteration of the segments and the initial SOC boundary condition.

The results of the optimization loops carried out for the electrical system are used to determine the corresponding level of power take-off from the gas turbine engine for the purpose of the electrical system. The level of power take-off from the engine via the generator determines the rate/state of charge of the energy storage, which is the only unfixed parameter in the system. By doing so, engine performance is influenced for the relevant segment. For example, the load on the engine in respect of the electrical system can be reduced or removed entirely for a particular segment if it is not efficient to produce electrical energy on that segment due to the thrust demands on the engine. In such circumstances, the energy storage 22 may discharge over a segment to accommodate the electrical loading. Conversely, the load on the engine in respect of the electrical system can be increased to forecast any future required unloading when the capacity of the engine so allows.

Figure 6:
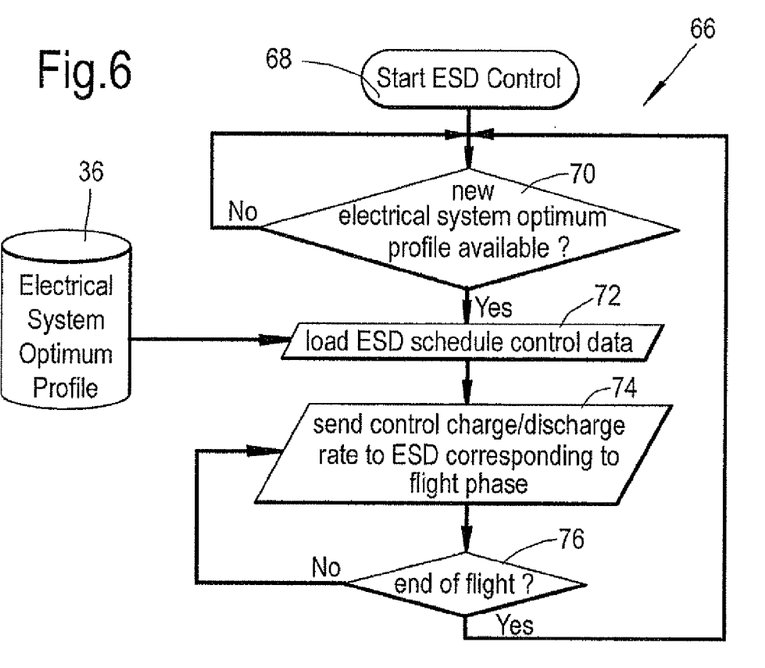

Turning now to FIG. 6, the charge and discharge of the one or more electrical storage devices 22 is controlled as shown in flowchart 66. The control scheme is implemented by one or more ESD control modules within the controller 24. The control scheme initiates at the stat of the first segment at 68, which may occur automatically based on one or more sensed conditions, such as, for example, the disconnection of a ground-based power source from the ESD, or else the determination that the state of charge of the ESD equals the prescribed boundary condition at the start of the first segment.

At 70, the controller determines whether there is an existing or a new desired electrical system profile available. The desired electrical system profile is received or retrieved at 72 and control of the ESD is initiated. The desired profile is achieved at 74 by issuing of control signals diverting power from the generator 14 to the ESD 22 based on the power take-off from the gas turbine engine 12 via turbine shaft 18. In conjunction therewith, the rate of discharge of the ESD to the aircraft electrical system 16 is controlled to meet aircraft loads 20. Control signals are issued in respect of each flight segment such that the ESD is operated at a steady state of charge or discharge for each individual segment in turn.

The control signals are updated for each flight segment at 76 until the end condition is achieved, which may comprise the final boundary condition for the ESD and/or another sensed parameter indicative of landing, such as a weight-on-wheels signal, an aircraft velocity signal or else the connection of an external ground-based power source.

Alongside the steps of FIG. 6, a continuous or intermittent monitoring loop is operated to detect substantial deviation from the predicted electrical system profile beyond a normal operating threshold. Additionally or alternatively, the controller 24 may monitor whether new electrical system profile data is received. In either event, the controller implements the new control scheme in pace of the current scheme.

The present invention offers a pragmatic method of implementing global electrical system optimisation, for which calculations can be run in realistic timescales.

The energy optimisation calculation and energy store control modules described above represent examples of the core functionality of a system according to the present invention. However it is proposed that practical embodiments of the present invention may require further modules and/or functionality for implementation.

In accordance with the above-described embodiments, the present invention proposes to use an energy storage technology to improve global or overall efficiency of the aircraft electrical systems, rather than the conventional focus on electrical system safety and stability of electrical networks. The invention seeks to make use of predicted operational performance of the gas turbine engine and onboard electrical system to accommodate improved fuel efficiency and overall system functionality for the total duration of a flight. This is in contrast to conventional thinking which favours mission achievement and autonomy of the airframe electrical systems and the gas turbine engine operation.

The embodiments described above may be applied to an aircraft electrical system having a gas turbine based prime mover for intended use in either civil or defence aerospace applications, including unmanned aerial vehicles (UAV).

The invention claimed is:

1. A method of managing power within an aircraft electrical system, the aircraft comprising a generator driven by a gas turbine engine for a supply of electrical power to the system, wherein the generator and electrical system are connected to a common energy store, the method comprising:
  determining or receiving predicted electrical energy demands of the system over at least a portion of a flight;
  determining or receiving predicted thrust demands for the gas turbine engine over the at least said portion of the flight;
  defining a plurality of time periods within at least said portion of the flight;
  determining a desirous rate of charge and discharge of the common energy store for each time period based upon the predicted thrust demands and the predicted electrical energy demands over said time period; and
  controlling a rate of charge of the common energy store during at least said portion of the flight in accordance with the determined desirous rate of charge and discharge for each time period.

2. The method of claim 1, wherein at least the portion of said flight comprises the entire flight from takeoff to landing.

3. The method of claim 1, wherein the predicted electrical energy demands and the predicted thrust demands are fixed for each time period and the desirous rate of charge and discharge of the common energy store is determined to accommodate said fixed demands.

4. The method of claim 1, wherein a plurality of points in time are defined within at least said portion of the flight, the time periods being the duration between said points in time, wherein the desirous rate of charge and discharge for each time period is determined based upon a difference between states of charge at corresponding points in time.

5. The method of claim 1, wherein the desirous rate of charge and discharge is determined to be a constant for each time period.

6. The method of claim 1, wherein a recursive processing technique is used that iterates towards the desirous rate of charge and discharge for each time period.

7. The method of claim 6 wherein a plurality of possible rates of charge and discharge for each time period are determined based upon a determined desirous state of charge at the start or end of said period, and wherein the desirous rate of charge and discharge for each time period is selected based upon a global appreciation of an energy efficiency of a charge profile for the common energy store over an entire portion of the flight.

8. The method of claim 1, wherein an initial state of charge of the common energy store is defined as a maximum state of charge for at least said period of the flight and a final state of charge of the common energy store is defined as a minimum state of charge for at least said period of the flight.

9. The method of claim 1, wherein the determining the desirous rate of charge and discharge is performed for a final time period of at least said portion of a predicted flight and proceeds through each successive time period backward in time.

10. The method of claim 1, wherein the controlling the rate of charge comprises controlling an amount of electrical energy supplied to the common energy store from the generator.

11. The method of claim 1, wherein the controlling the rate of charge comprises controlling power drawn from the gas turbine engine by the generator.

12. The method of claim 1, wherein a deviation of actual electrical energy demands and/or gas turbine thrust demands from said predicted demands during at least said portion of the flight is monitored and the desirous rate of charge and discharge of the common energy store is recalculated for a remainder of at least said portion of the flight in an event that the actual electrical energy demands and/or gas turbine thrust demands deviate beyond a normal operational threshold of the predicted demands.

13. The method of claim 1, wherein a deviation of actual rate of charge and discharge from said desirous rate of charge and discharge during at least said portion of the flight is monitored and the desirous rate of charge and discharge of the common energy store is recalculated for a remainder of at least said portion of the flight in the event that the actual rate of charge and discharge deviates beyond a normal operational threshold of the desirous rate of charge and discharge.

14. An aircraft power management system comprising:
a gas turbine engine;
a generator connected to the gas turbine engine and arranged to supply electrical power to an aircraft electrical system in use;
an energy store arranged for electrical connection to the generator and the aircraft electrical system; and,
a controller arranged to control a rate of charge of the energy store by the generator in use, wherein the controller controls the rate of charge of the energy store in successive time periods in accordance with a predetermined desirous rate of charge and discharge for each time period based upon predicted airframe electrical energy system demands and predicted engine thrust demands during an entire flight.

15. A method of determining a supply of electrical energy between a generator driven by a gas turbine engine and an energy store for an aircraft electrical energy system, the method comprising:
determining or receiving predicted electrical energy demands over at least a portion of a flight;
determining or receiving predicted thrust demands on the gas turbine engine over at least said portion of the flight;
defining a plurality of time periods within at least said portion of the flight;
determining or receiving a boundary condition state of charge for at least said portion of the flight; and
applying a recursive scheme for determining a desirous rate of charge and discharge of the energy store for each time period in turn based upon the predicted thrust and electrical energy demands.

16. A non-transitory data carrier including machine readable instructions for controlling one or more processors to conduct a method of managing power within an aircraft electrical system, the aircraft comprising a generator driven by a gas turbine engine for a supply of electrical power to the system, wherein the generator and electrical system are connected to a common energy store, the instructions comprising:
determining or receiving predicted electrical energy demands of the system over at least a portion of a flight;
determining or receiving predicted thrust demands for the gas turbine engine over at least said portion of the flight;
defining a plurality of time periods within at least said portion of the flight;
determining a desirous rate of charge and discharge of the common energy store for each time period based upon the predicted thrust demands and the predicted electrical energy demands over said time period; and
controlling a rate of charge of the common energy store during at least said portion of the flight in accordance with the determined desirous rate of charge and discharge for each time period.

17. A non-transitory data carrier including machine readable instructions for controlling one or more processors to conduct a method of determining a supply of electrical energy between a generator driven by a gas turbine engine and an energy store for an aircraft electrical energy system, the instructions comprising:
determining or receiving predicted electrical energy demands over at least a portion of a flight;
determining or receiving predicted thrust demands on the gas turbine engine over at least said portion of the flight;
defining a plurality of time periods within at least said portion of the flight;
determining or receiving a boundary condition state of charge for at least said portion of the flight; and
applying a recursive scheme for determining a desirous rate of charge and discharge of the energy store for each time period in turn based upon the predicted thrust and electrical energy demands.

* * * * *